US008594366B2

(12) United States Patent
Zou et al.

(10) Patent No.: US 8,594,366 B2
(45) Date of Patent: Nov. 26, 2013

(54) CONTEXT-BASED ADAPTIVE BINARY ARITHMETIC CODING (CABAC) VIDEO STREAM COMPLIANCE

(75) Inventors: Dekun Zou, Princeton, NJ (US); Jeffrey Adam Bloom, West Windsor, NJ (US); Shan He, Plainsboro, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 286 days.

(21) Appl. No.: 12/737,736

(22) PCT Filed: Aug. 17, 2009

(86) PCT No.: PCT/US2009/004713
§ 371 (c)(1),
(2), (4) Date: Feb. 11, 2011

(87) PCT Pub. No.: WO2010/021699
PCT Pub. Date: Feb. 25, 2010

(65) Prior Publication Data
US 2011/0135143 A1 Jun. 9, 2011

Related U.S. Application Data

(60) Provisional application No. 61/189,372, filed on Aug. 19, 2008.

(51) Int. Cl.
*G06K 9/00* (2006.01)
(52) U.S. Cl.
USPC ........... 382/100; 382/236; 382/232; 382/250; 382/251; 382/253
(58) Field of Classification Search
USPC ......... 382/100, 232, 233, 236, 250, 251, 253; 348/463, 467; 380/54, 201, 210, 252, 380/287
See application file for complete search history.

(56) References Cited

U.S. PATENT DOCUMENTS 5,867,109 A  2/1999  Wiedeman
6,009,176 A  12/1999  Gennaro et al.
(Continued)

FOREIGN PATENT DOCUMENTS

CN  101218830  7/2008
EP  1515506  3/2005
(Continued)

OTHER PUBLICATIONS

International Search report dated Oct. 16, 2009.
(Continued)

*Primary Examiner* — Ali Bayat
(74) *Attorney, Agent, or Firm* — Robert D. Shedd; Jeffrey M. Navon (57) ABSTRACT

A method of providing CABAC compliant changes such as watermarks comprises accessing encoded data such as video which comprise at least two blocks; creating or accessing a list of changes to the encoded data that include a direct change to a block; determining motion character or motion vector differential of non-immediate block, non-immediate blocks being adjacent to an immediate block that are immediately adjacent to the block; determining change to the immediate block based on original motion character of the block and the non-immediate block and the motion character of the block that would result from the application of the change; storing the change to the list if the change does not cause a difference to the immediate block; and evaluating other potential changes if other potential changes are available, wherein the other potential changes are subjected to the same process steps as the direct change.

19 Claims, 5 Drawing Sheets

(56) References Cited

U.S. PATENT DOCUMENTS

| | | | |
|---|---|---|---|
| 6,064,661 A | 5/2000 | Benn | |
| 6,341,350 B1* | 1/2002 | Miyahara et al. | 713/176 |
| 6,373,960 B1 | 4/2002 | Conover et al. | |
| 6,894,628 B2 | 5/2005 | Marpe et al. | |
| 6,900,748 B2 | 5/2005 | Marpe et al. | |
| 7,113,612 B2 | 9/2006 | Sugahara et al. | |
| 7,197,164 B2 | 3/2007 | Levy | |
| 7,286,710 B2 | 10/2007 | Marpe et al. | |
| 7,646,881 B2 | 1/2010 | Zarrabizadeh | |
| 7,839,312 B2 | 11/2010 | Tanaka et al. | |
| 7,865,034 B2 | 1/2011 | So | |
| 7,974,714 B2 | 7/2011 | Hoffberg | |
| 8,121,341 B2 | 2/2012 | Tapson et al. | |
| 2002/0136428 A1 | 9/2002 | Sugahara et al. | |
| 2003/0070075 A1 | 4/2003 | Deguillaume et al. | |
| 2004/0017852 A1 | 1/2004 | Garrido et al. | |
| 2004/0168110 A1 | 8/2004 | Fuldseth et al. | |
| 2004/0247154 A1 | 12/2004 | Bodo et al. | |
| 2005/0044411 A1 | 2/2005 | Somin et al. | |
| 2005/0069169 A1 | 3/2005 | Zarrabizadeh | |
| 2005/0123207 A1 | 6/2005 | Marpe et al. | |
| 2005/0207499 A1 | 9/2005 | Hwang et al. | |
| 2006/0078292 A1 | 4/2006 | Huang et al. | |
| 2006/0236130 A1 | 10/2006 | Ito et al. | |
| 2006/0269096 A1 | 11/2006 | Kumar et al. | |
| 2007/0053438 A1 | 3/2007 | Boyce et al. | |
| 2007/0110033 A1 | 5/2007 | Tu et al. | |
| 2007/0242862 A1 | 10/2007 | Watson et al. | |
| 2008/0009272 A1 | 1/2008 | Toledano | |
| 2008/0063071 A1* | 3/2008 | Suzuki | 375/240.16 |
| 2008/0165849 A1 | 7/2008 | Moriya et al. | |
| 2009/0290750 A1 | 11/2009 | Tapson et al. | |
| 2011/0129116 A1* | 6/2011 | Thorwirth | 382/100 |
| 2011/0176610 A1 | 7/2011 | He et al. | |
| 2011/0222723 A1 | 9/2011 | He et al. | |
| 2011/0293016 A1* | 12/2011 | Suzuki | 375/240.16 |
| 2012/0237078 A1 | 9/2012 | Watson et al. | |

FOREIGN PATENT DOCUMENTS

| | | |
|---|---|---|
| EP | 1909508 | 4/2008 |
| JP | 11341450 | 12/1999 |
| JP | 2001119557 | 4/2001 |
| JP | 2003134329 | 5/2003 |
| JP | 2003179740 | 6/2003 |
| JP | 2004221715 | 8/2004 |
| JP | 2005533410 | 11/2005 |
| JP | 2006279992 | 10/2006 |
| JP | 2006303580 | 11/2006 |
| JP | 2007053687 | 3/2007 |
| JP | 2007525074 | 8/2007 |
| WO | WO2004066206 | 8/2004 |
| WO | WO2007067168 | 6/2007 |
| WO | WO2008065814 | 6/2008 |
| WO | WO2008118145 | 10/2008 |
| WO | WO2008154041 | 12/2008 |

OTHER PUBLICATIONS

Nguyen et al., "A Fast Watermarking System for H.264/AVC Video," 2006 IEEE, Dept. of Electronic Engineering, La Trobe University, Bundoora, Australia, pp. 81-84.

Seo et al., "Low-Complexity Watermarking Based on Entropy Coding in H.264/AVC," IEICE Trans. Fundamentals, vol.E91-A, No. 8, Aug. 2008.

Noorkami, "Secure and Robust Compressed-Domain Video Watermarking for H.264," A Thesis Presented to The Academic Faculty at Georgia Institute of Technology, 124 pages, Aug. 2007.

Zou et al., "H.264/AVC Stream Replacement Technique for Video Watermarking", ICASSP, 2008 IEEE, 2008.

Mobasseri et al., "Authentication of H.264 Streams by Direct Watermrking of CACLC Blocks", Security, Steganography, and Watermarking of Multimedia Contents IX, Proceedings of SPIE-IS&T Electronic Imaging, SPIE, vol. 6505, 65951W, 2007.

Profrock et al, "H.264/AVC Video Authentication using Skipped Macroblocks for an Erasable Watermark", Visual Communications and Image Processing, 2005 SPIE, Bellinigham, WA 2005.

Hu, "Information Hiding Based on Intra Predictioin Modes for H.264 AVC", Multimedia and Expo, 2007 IEEE, International Conference, IEEE PI, Jul. 1, 2007, pp. 1231-1234.

Winkler, "Preceptual Quality Assessments for Video Watermarking", Proceedings from the IEEE Conference on Standardizaton and Innovation in Information Technology, Oct. 18, 2002, pp. 90-94.

Liu et al., "Data Hiding in Inter and Intra Prediction Modes of h.264/AVC", IEEE Int'l. Symposium on Circuits and Systems, 2008 (ISCAS 2008), May 18, 2008, pp. 3025-3028.

Song et al., "A Data Embedded Video Coding Scheme for Error-Prone Channels", IEEE Transactions on Multimedia, vol. 3, No. 4, Dec. 1, 2001, pp. 415-423.

* cited by examiner

CONTEXT-BASED ADAPTIVE BINARY ARITHMETIC CODING (CABAC) VIDEO STREAM COMPLIANCE

CROSS-REFERENCE

This application claims the benefit, under 35 U.S.C. §365 of International Application PCT/US2009/04713, filed Aug. 17, 2009, which was published in accordance with PCT Article 21(2) on Feb. 25, 2010 in English and which claims the benefit of United States provisional patent application No. 61/189,372, filed Aug. 19, 2008.

FIELD OF THE INVENTION

The present invention relates to embedding watermarks in Context-based Adaptive Binary Arithmetic Coding (CABAC) video streams.

BACKGROUND OF THE INVENTION

Today, the demand for digital watermarking as an antipiracy technology is strong. To make it more difficult for pirates to circumvent watermarks it is important for many potential watermarks to be proposed and used. However, it is important for watermarks to not interfere with the intended viewing experience for the intended audience. As such, a need exists for more efficient watermarking techniques. As such, a goal of this invention is to generate a list of possible changes generally associated with watermarking that are CABAC/AVC compliant, and yet do not create visible artifacts, thereby ultimately providing an efficacious method for embedding watermarks in a CABAC video stream.

SUMMARY OF THE INVENTION

A method of providing CABAC compliant changes such as watermarks comprises accessing encoded data such as video data which comprise at least two blocks; creating or accessing a list of changes to the encoded data that include a direct change to a block; determining motion character or motion vector differentials of non-immediate blocks, non-immediate blocks being adjacent to an immediate block that are immediately adjacent to the block; determining change to the immediate block based on original motion character of the block and the non-immediate block and the motion character of the block that would result from the application of the change; storing the change to the list if the change does not cause a difference to the immediate block; and evaluating other potential changes if other potential changes are available, wherein the other potential changes are subjected to the same process steps as the direct change. Blocks can be any size or number of a collection elements or pixels, immediate blocks can be blocks that share some finite border with the block, and non-immediate blocks can be blocks that share some finite border with the immediate blocks, but not with the block. The method can include decoding the encoded data and coding the encoded data which can include using changes that have been stored in the list. The method can include determining a context for the encoded data for at least one of the blocks and/or determining a context index for the encoded data, wherein the context index (ctxIdx) is the sum of an initial value (ctxIdxOffset) and an increment (ctxIdxInc). The method can further include calculating or computing an original increment for the immediate block and a new increment for the immediate block associated with the direct change to the block; and using the original and new increments as a criterion for determining the difference in the storing step, wherein a motion vector differential of the non-immediate block and the original and new motion vector differentials for the block can be used as a criterion for determining the difference in the storing step. If the original increment for the immediate block and a new increment for the immediate block are different for a change, the change can be removed from the list in the storing step. The method can further include the step of calculating or computing an original increment for another immediate block and a new increment for the another immediate block associated with the direct change to the block, if the original and immediate increments are not different for the immediate block; and using the original and new increments for the another immediate block as an additional criterion for determining the difference in the storing step. A motion vector differential for the another non-immediate block that is adjacent to the another immediate block and the original and the new motion vector differentials for the block can be used as an additional criterion for determining the difference in the storing step. Additionally, the change can be added to the list in the storing step if the original and new increments for the another immediate block are not different.

BRIEF DESCRIPTION OF THE DRAWINGS

The invention will now be described by way of example with reference to accompanying drawings.

DESCRIPTION OF THE INVENTION

Watermark embedding is herein performed by changing data bytes in a coded video stream such as CABAC (Context-based Adaptive Binary Arithmetic Coding) coded video stream. It is important to point out that CABAC coding in the context of H.264/AVC video encoders is mentioned throughout to emphasize that the disclosed invention will be generally applicable to such CABAC coded video streams. However, the scope of the invention is generally applicable to other coded data streams and other types of encoders.

With the understanding that watermarking can cause an AVC decoder failure, crash or the like, embodiments are presented that are directed to avoid negative events.

Of importance is the understanding that portions of encoded video bitstreams, such as those conforming to the H.264/AVC video coding standard, cannot be blindly modified while maintaining CABAC compliance. In a system that allows modifications under the constraint of maintaining CABAC compliance, changes may be intended to mark or watermark the video data. Such changes can be designed to identify modifications that can be made such that the modifications do not affect any CABAC contexts. However, a special case can arise in which a modification can influence the contexts used for the encoding/decoding of subsequent syntax elements. In particular, a modification might not change the current context of an encoder, but might nonetheless change the context that is selected at a decoder. When this occurs, the CABAC decoder will apply the wrong context, typically causing a decoding error. This application describes one or more embodiments that identify the special cases in which this error may occur and avoid modifications that would cause such errors.

The context of the invention is applicable to the operation of H.264/AVC CABAC coding algorithms, wherein an arithmetic coding system is used to improve entropy coding. CABAC achieves good compression performance through (a) selecting probability models for each syntax element according to the element's context; (b) adapting probabilities estimates based on local statistics; and (c) using arithmetic coding.

Figure 1:
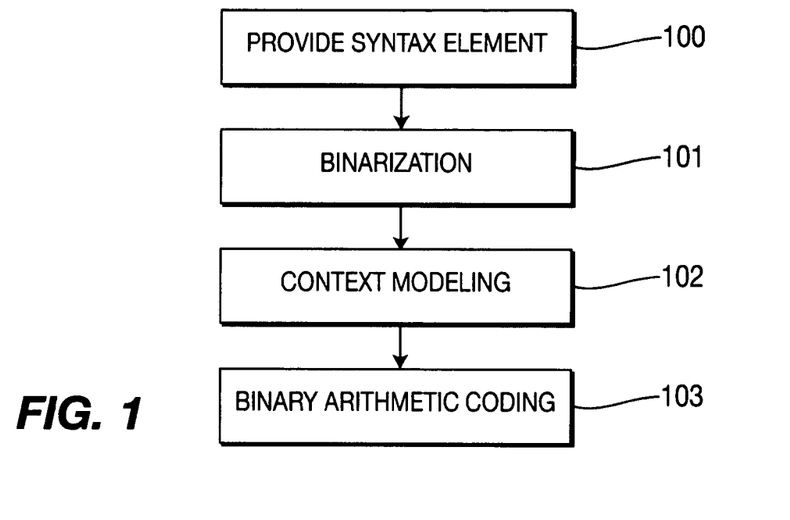
FIG. 1 is a flow chart of CABAC encoding.

FIG. 1 shows a generic block diagram for encoding a single syntax element 100 in CABAC. The coding process consists of up to three elementary steps: 1) binarization evaluation 101; 2) context modeling 102; and 3) binary arithmetic coding 103.

Figure 2:
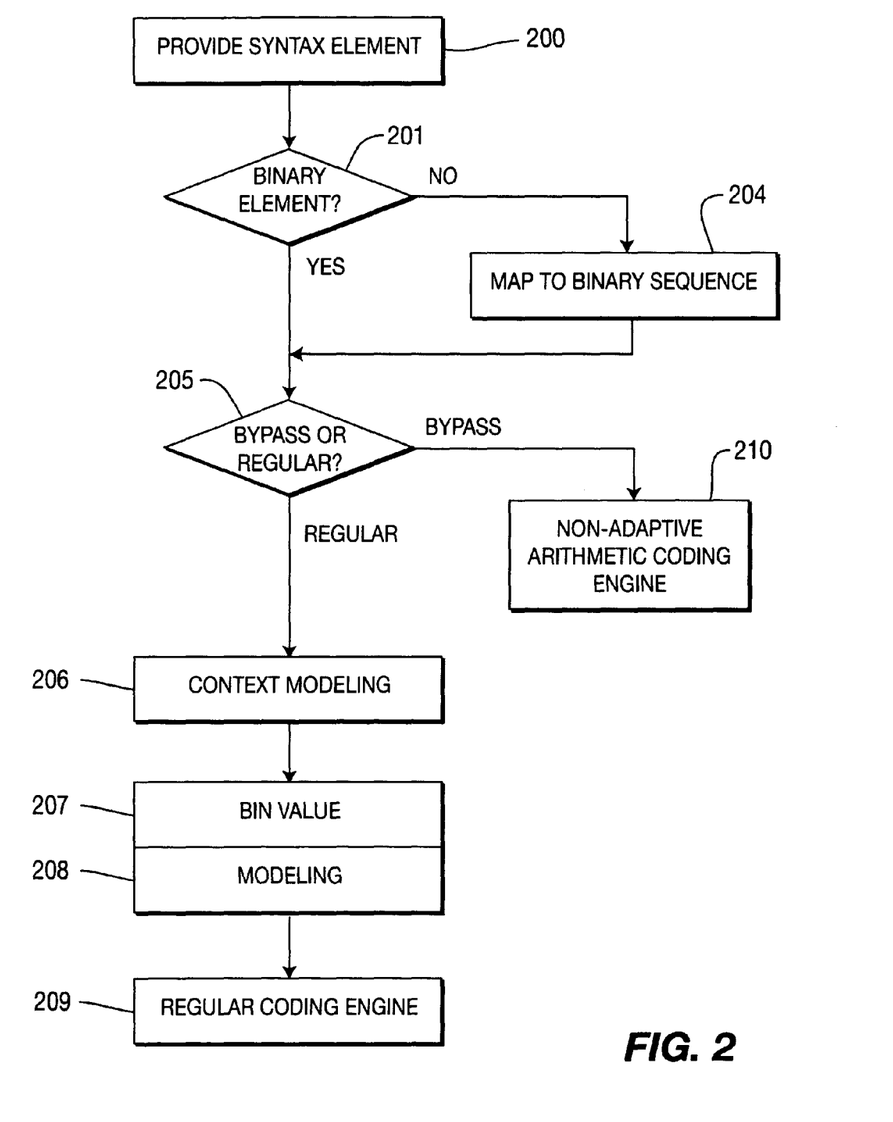
FIG. 2 is a more detailed flowchart of CABAC encoding.

A more detailed view is provided in FIG. 2. A syntax element is provided in block 200 followed by evaluating the syntax element in decision block 201, wherein a non-binary element advances to step 204. The non-binary element component is uniquely mapped to a binary sequence into a so-called bin string in block 204. The mapped sequence and syntax element which were originally binary valued in decision block 201, will advance to decision block 205. In decision block 205, each element of the bin string or each binary valued element will be processed in a regular coding mode or in a bypass coding mode.

In the regular coding mode, a context modeling step 206 is performed, wherein a probability model is selected such that the corresponding choice of a context depends on previously encoded syntax elements or bins. After the assignment of a context mode, the bin value 207 and its associated model 208 are passed to the regular coding engine 209, where the final stage of arithmetic coding and a subsequent model updating are processed.

In the bypass coding mode, to speed up the whole coding process, a simplified non-adaptive arithmetic coding engine or bypass coding engine 210 without the use of probability estimation and an update process is applied.

A final step of H.264/AVC compression can be entropy encoding, wherein at least one of the entropy encoding methods supported by that standard is CABAC. CABAC is a binary arithmetic coding technique in which the coding of a particular AVC syntax element is performed with respect to a specific probability model which is determined by a set of variables, collectively called a context. The CABAC encoder maintains many contexts and selects one for the encoding of each syntax element or even for the encoding of each bit at different bit positions of the same syntax element. In many cases, the encoding process results in a modification of the context variables. Each context maintains a set of context variables. The encoding process can change the variables inside that context.

A first step of H.264/AVC decompression is entropy decoding. When the stream is CABAC-encoded, the decoding is CABAC decoding. The CABAC decoder maintains many contexts and uses different contexts to decode different syntax elements or even bits at different bit positions of the same syntax element. Each context maintains a set of context variables. In many cases, the decoding process results in a modification of the context variables of the corresponding context. Different contexts are identified by a context index. It is important that the data be coded in such a way so that the decoder and encoder remain synchronized. The decoder needs to use an appropriate context for any particular element (i.e., which context was used to encode that element). The variables of that context, or the state of that context, need to be as predicted in the encoder.

It is possible and useful to modify certain CABAC-encoded syntax elements in a bitstream without modifying any of the context states. However, it is possible that a special case can occur in which the modifications result in the wrong context being used for decoding of a subsequent syntax element.

Now, the binarization of a motion vector differential (MVD) can consist of a prefix, and if the MVD is larger than 9, a suffix, wherein the binarized MVD can be denoted or defined as MVDBIN. The CABAC context used to decode the prefix of the MVDBIN of an inter-predicted block is determined by the context index "ctxIdx" as specified in the H.264/AVC standard. This index is calculated from the sum of two variables, ctxIdxOffset and ctxIdxInc, an initial index value and an increment, respectively, as shown in the following equation:

$$ctxIdx = ctxIdxOffset + ctxIdxInc$$

Figure 3:
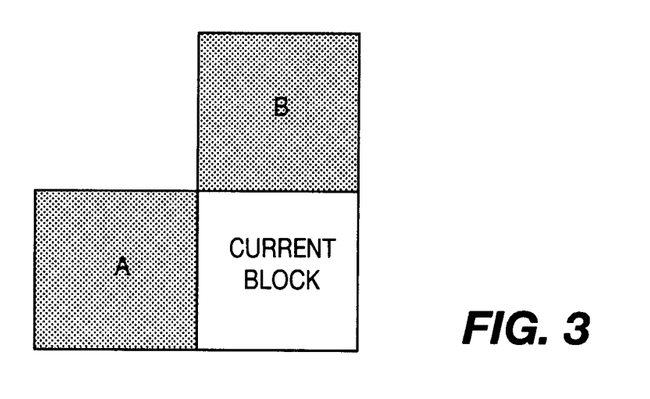
FIG. 3 illustrates motion vector differentials for blocks affected by a change.

The ctxIdxOffset is specified in the standard. Specifically, ctxIdxOffset is 40 for the horizontal component of the MVDBIN and 47 for the vertical component of the MVDBIN. The ctxIdxInc is different for different bit positions of the MVDBIN prefix. For bits other than the first bit, the ctxIdxInc is determined by bit position. Specifically, ctxIdxInc is 3, 4, 5, 6, 6, 6 at bit positions 1, 2, 3, 4, 5, 6 (or greater), respectively. For the first bit (bit position 0) of the MVD prefix, the CABAC encoder and decoder determine the value of the increment, ctxIdxInc, by examining the absolute values of the MVDs (the entire MVD) of the neighboring blocks, specifically, the neighbor to the left (A) and the neighbor above (B), as shown in FIG. 3 where the current block is labeled "Cur." The bit position determines the ctxIdxInc for bits other than the first of a prefix of an MVDBIN. Blocks A and B in FIG. 3 can be referred to as immediate blocks, because they share a border with the current block.

To encode/decode the first bit of a prefix of the MVDBIN of an intra-predicted block, there are three possible contexts that can be used, as explained below. The first context is indexed by ctxIdxOffset, the second by ctxIdxOffset+1, and the third by ctxIdxOffset+2. Thus, the variable ctxIdxInc can take the values 0, 1, or 2 and this variable is used to select from the three available contexts. The first of these contexts is used for cases in which the current MVD is expected to be small, the second is used when the value of the current MVD is expected to be moderate, and the third is used when the current MVD is expected to be large. The expectation is based on the neighboring MVD values as follows:

If (absMvd_A+absMvd_B) is less than 3, ctxIdxInc is set equal to 0.

If (absMvd_A+absMvd_B) is in the range of 3 to 32, inclusive, ctxIdxInc is set equal to 1.

If (absMvd_A+absMvd_B) is greater than 32, ctxIdxInc is set equal to 2.

In short, the (absMvd_A+absMvd_B) can fall into three regions: [0, 3), [3, 32] and (32, +∞). (Notations are order theory notations: right-open interval, closed interval and open interval, respectively.)

Figure 5:
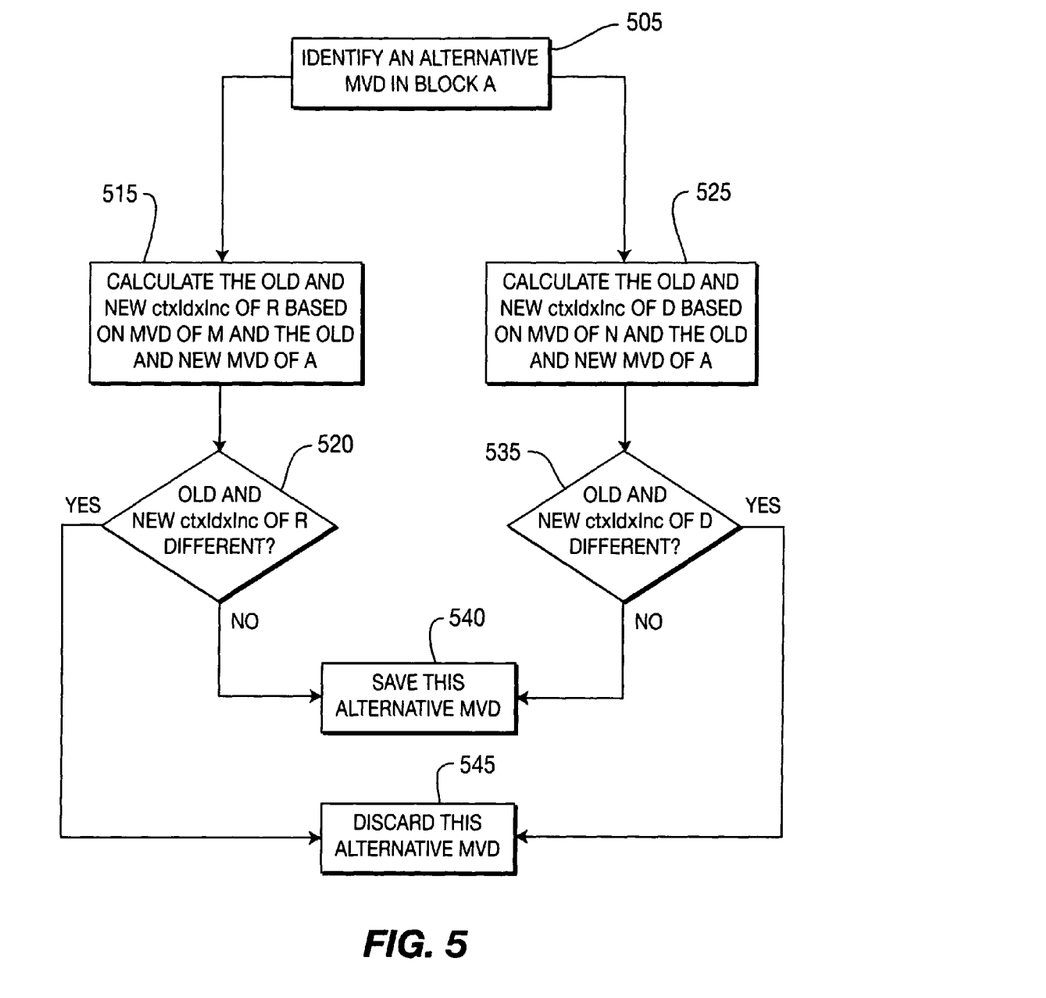
FIG. 5 illustrates a flow chart of a first solution for avoiding errors in encoding.

One or more of the embodiments in the attached application can possibly result in modifications to MVDs of some blocks while taking care not to cause any context states to change. However, if the MVD of block A or that of block B change or if both change due to the modifications in such an embodiment, the new value of (absMvd_A+absMvd_B) could fall into a different region than the original one. In that case, the ctxIdxInc will be changed and the wrong context will be used for the decoding of the prefix of the MVDBIN of the current block. Thus, the CABAC decoder will behave differently in decoding the MVD of block Cur and decoding errors can result. A first solution to these decoding errors pertaining to potential modifications can be made that does not induce any changes in context states and is illustrated in FIG. 5. Each of these potential modifications can be evaluated by a number of criteria including its ability to represent data, its impact on the fidelity of the decoded imagery, the robustness of the resulting pixel changes, etc. Of the list of potential modifications identified, only those that meet the particular application dependent criteria are generally selected for use in the watermarking process and the rest are generally discarded.

This evaluation can be extended by examining each potential modification to determine if it would induce a change in ctxIdxInc of any other block, thus possibly causing a decoding error. Potential modifications that do induce a change in ctxIdxInc of another block are, in at least one implementation, discarded.

Figure 4:
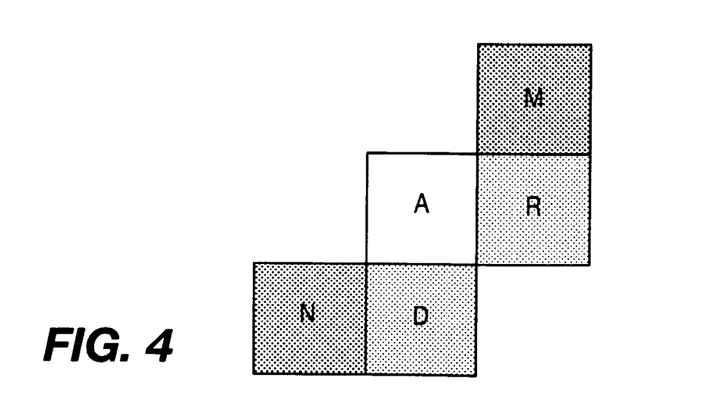
FIG. 4 illustrates another set of motion vector differentials for blocks affected by a change.

For a potential modification in block A that will affect the MVD of block A, the MVDs of its two neighboring blocks, R (Right) and D (Down), might be affected as shown in FIG. 4. Here blocks R and D are immediate blocks and M and N are non-immediate blocks, because they do not share a border with the current block A, but share a border with the immediate blocks.

To check if the modification will cause a decoding error, this solution checks whether this modification of the MVD in block A will cause a change in the ctxIdxInc of the prefix of the MVD in block R or the prefix in block D. This leads to an algorithm described in FIG. 5. Here, in step 505, alternative MVDs in block A are determined. For a potential modification that affects the MVD of block A, the ctxIdxInc in block R and block D are examined or determined. In each of these two cases, the old ctxIdxInc that would have been used if the change in block A had not been made is calculated. Also, the new ctxIdxInc that would have been used if the change in block A is made in steps 515 for the R block and in step 525 for the D block is calculated, wherein these example adjacent block to the current A block are shown in FIG. 5. In either case, for the R block in decision block 520 and for the D block in decision block 535, in at least one embodiment, if the old ctxIdxInc and the new ctxIdxInc differ, then the potential modification is discarded in step 545, because it has the potential to cause the decoding error described above. If the old and new ctxIdxInc are the same, then the alternative MVD in block A is saved in step 540.

Note that the ctxIdxInc for block R is dependent, not only on the MVD of block A, but also on the MVD of block M, which is immediately adjacent to block R. The ctxIdxInc for block R is determined by the range in which the (absMvd_A+absMvd_M) falls. Similarly, the ctxIdxInc of block D depends on both the MVD of block A and the MVD of block N, an adjacent block to D, as it is determined by the range in which the (absMvd_A+absMvd_N) falls.

The algorithm of FIG. 5 can be considered to be "Block A centric." Here a potential change in block A is considered and the impact downstream is evaluated.

There is a case in which the algorithm described above and shown in FIG. 5 may not detect or identify all decoding errors. Referring to FIG. 3, the evaluation process of FIG. 5 will not necessarily completely address the case when the MVDs of both block A and block B are modified. Another solution is proposed to consider this case.

Figure 6:
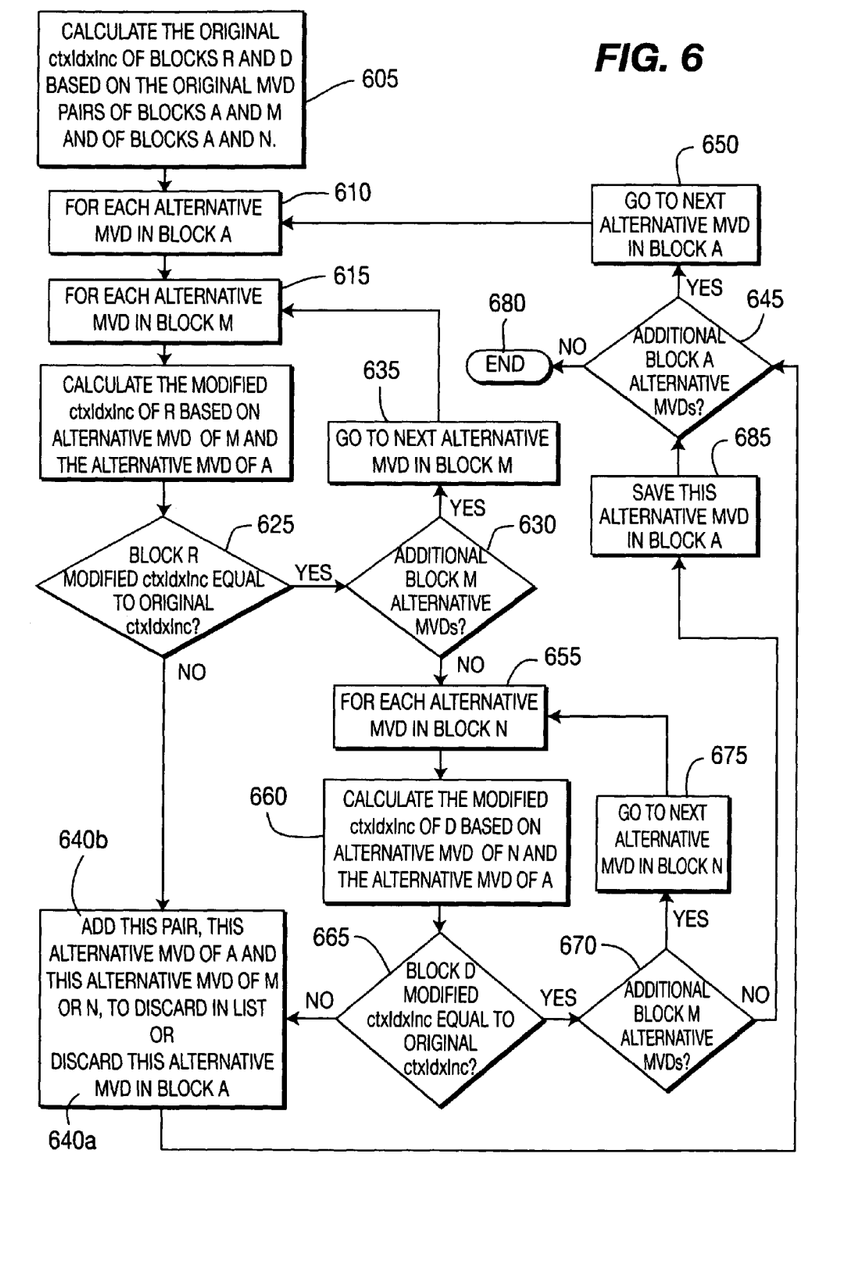
FIG. 6 illustrates a flow chart of a second solution and a third solution for avoiding errors in encoding.

A second solution and a third solution are illustrated in FIG. 6 which shows extended versions of that of FIG. 5. The second and third solutions differ in that the second solution uses the step 640a option and the third solution uses the step 640b option.

Regarding the second solution, essentially, for each alternative MVD in block A, the effects on the ctxIdxInc of blocks D and R in FIG. 4 are considered or processed. What is different in this solution is that in the cases in which the MVDs of blocks M and N themselves, the alternative values are considered. Here, it is desirable to retain block A's alternative MVDs that will not change the ctxIdxInc of blocks D or R, regardless of which alternatives can be selected for blocks M or N.

FIG. 6 shows one algorithm for doing this. For each alternative MVD for block A, all possible MVDs for block M are considered or processed first. Each combination can be evaluated to determine if any combination will change the ctxIdxInc of block R. If any combination changes the ctxIdxInc of block R, that alternative MVD for block A can be discarded. If none of the combinations (for a given alternative MVD for block A) change the ctxIdxInc of block R, then all possible MVDs for block N can be considered. Each combination can be evaluated to determine if any combination will change the ctxIdxInc of block D. If any combination changes the ctxIdxInc of block D, that alternative MVD for block A is discarded. If none of the combinations change the ctxIdxInc of block D, this alternative MVD for block A is saved.

Specifically, FIG. 6 begins with a calculation of the original ctxIdxInc of blocks R and D based on the original MVD pairs of blocks A and M and block A and N in step 605. In step 610, each alternative MVD in block A is examined, followed by examining each MVD in block M in step 615. In step 620, a calculation is performed with the modified ctxdxInc of R based on the alternative MVD of M and the alternative MVD of M and the alternative of MVD of A. This is followed by decision step 625, wherein if the Block R modified ctxIdxInc equals the original ctxIdxInc, then additional block M alternative MVDs are examined in step 630 and if the Block R modified ctxIdxInc does not equal the original ctxIdxInc, then the alternative MVD in block A is discarded in step 640a. Following the discarding step 640a is another decision step 645 in which additional alternative block A MVDs are considered. If there are no further alternative block A MVDs, then the second solution is complete, which is represented by step 680. On the other hand, if there are additional alternative block A MVDs, the solution advances to step 650, in which the next alternative MVD in block A is accessed, followed by looping to step 610 and to the steps that followed step 610 as mentioned above.

With further reference to FIG. 6, when the Block R modified ctxIdxInc equals the original ctxIdxInc in step 625 and there are additional block M alternative MVDs in decision step 630, then the process advances to evaluating the next available alternative MVD in block M in step 635, followed by looping back to step 615 and to the steps that followed step 615 as mentioned above.

Additionally with reference to FIG. 6, when the Block R modified ctxIdxInc equals the original ctxIdxInc in step 625 and there are no additional block M alternative MVDs in decision step 630, then the process advances to accessing each alternative MVD in block N in step 655 and then to calculating the modified ctxdxInc of D based on the alternative MVD of N and the alternative MVD of A in step 660. Following step 660, if block D modified ctxIdxInc equals the original ctxIdxInc, then in decision block 665 the process advances to decision block 670, wherein additional block N alternative MVDs are accessed. If there are additional block N alternative MVDs, one advances to block 675, wherein the next MVD in block N is accessed followed by looping back to step 655 and to the steps that followed step 655 as mentioned above. If block D modified ctxIdxInc does not equal the original ctxIdxInc, then in decision block 665 the process advances to step 640*a* and advances according to the steps mentioned above with respect to step 640*a*.

If there are no additional block N alternative MVDs in decision step 670, the solution advances to step 685 in which the alternative MVD or MVDs in block A are saved, followed by advancing to decision step 645, in which additional block A alternative MVDs are accessed. If there are no more alternative block A MVDs, then the second solution is complete, which is represented by step 680. On the other hand, if there are additional alternative block A MVDs, the solution advances to step 650, in which the next alternative MVD in block A is accessed, followed by looping to step 610 and to the steps that followed step 610 as mentioned above.

This solution does discard any alternative MVD for block A that has a combination with any of the alternative MVDs for blocks M or N such that the combination will cause the ctxIdxInc of blocks D or R to change.

In some cases, removing the alternative MVD for block A may not be preferable or may need to be avoided. As such, a third solution is illustrated in FIG. 6 in which the step 640*b* option is used instead of the step 640*a* option. The third solution removes the other alternative MVD such as the one associated with block M or N, rather than the alternative for block A. This modification of the second solution makes it such that potentially detrimental combinations are recorded in a discard list. The discard list can later be processed to decide which alternatives should be removed.

There are many approaches that can be taken to process the discard list. Here are a few:

1. One approach is to consider any combination on the discard list for which one of the alternative MVDs is an original MVD. This combination is removed from the list by removing the other alternative MVD of the combination.
2. Another approach is to minimize the number of alternative MVDs removed by first building a histogram and for every alternative MVD on the discard list, count the number of times it appears. This is followed by removing the alternative MVD that appears most often, thereby removing from the discard list any combinations containing that alternative MVD. Additionally, alternative MVDs can be continually removed until the discard list is empty, from most frequently appearing to least frequently appearing,
3. In a third approach a histogram can be built for every alternative MVD on the discard list and the number of times it appears can be counted. Then, a fidelity model and/or a robustness model can assign a cost to each alternative MVD. This cost can be used, along with the histogram of frequency of occurrence, as a basis for removal of alternative MVDs until the discard list is empty.

Figure 7:
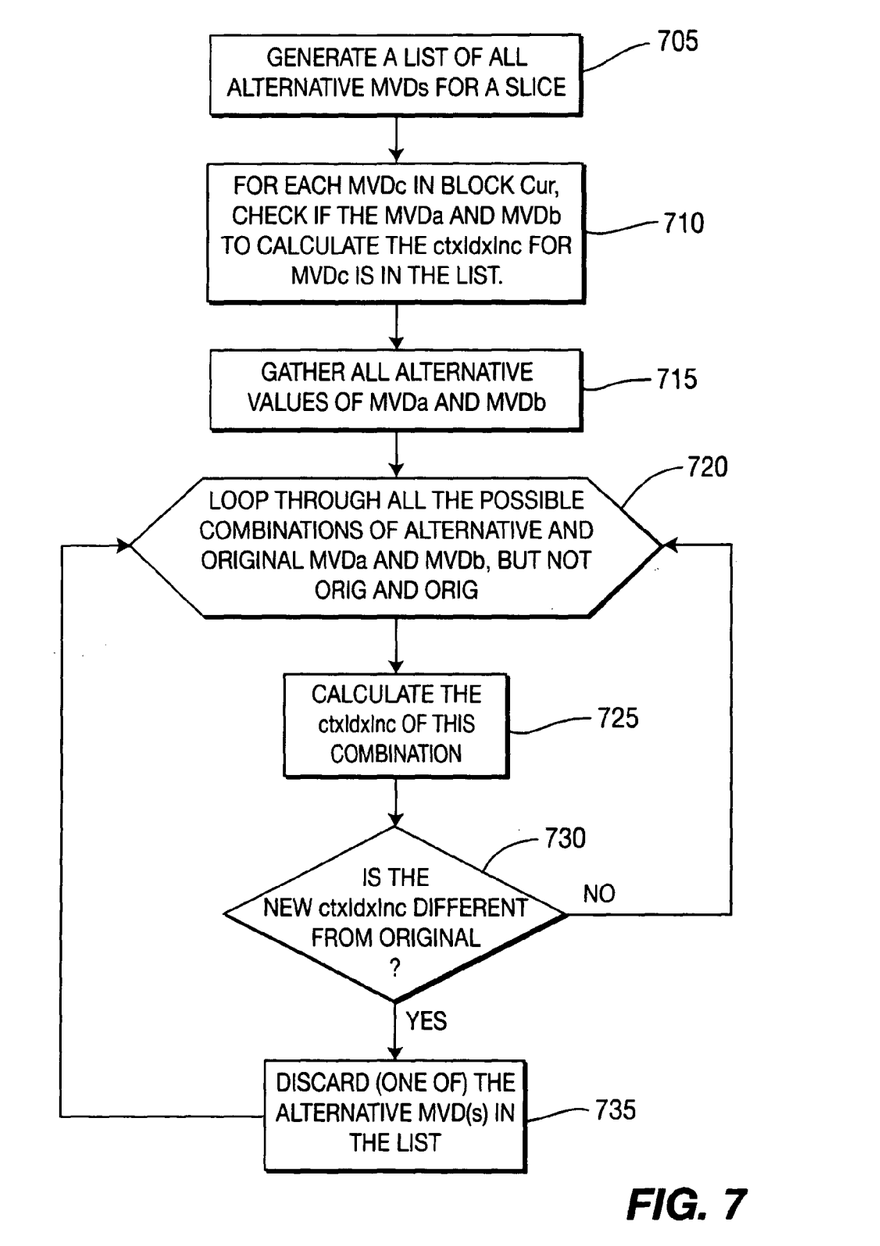
FIG. 7 illustrates a flow chart of a fourth solution for avoiding errors in encoding.

In contrast to the first three solutions, a fourth solution can be considered "Block C centric" or "Block Cur centric" in that a potential change in block Cur is evaluated and block A or block B are checked to determine if either block A or B has changes that can impact the ctxIdxInc of block Cur. This forth solution is illustrated in FIG. 7. In at least one implementation, the process of FIG. 7 is performed for every slice that has alternative MVDs in the image sequence.

The first step 705 is to create a list of potential modifications that apply to the blocks in the current slice. It should be pointed out that embodiments of the inventions are intended to include the feature of accessing and/or modifying an existing list. In this regard, a list can be compiled, accessed or generated having all alternative MVDs for a slice.

Next, in step 710, for a given inter-predicted block, all possible MVDs are considered. All inter-predicted blocks will have at least one MVD; however, for some, there are potential changes that have been identified. Each potential change will result in a different MVD for the current block, block C, wherein the MVD is referred to as MVDc. For the current block, Block C, there are two neighbors of interest, block A to the left and block B above as shown in FIG. 3. Each of these blocks will have a MVD; however, for some neighbors, there are potential changes that have been identified. Each potential change will result in a different MVD for that neighboring block, block A or block B. For MVDc in block C one considers or gathers all possible combinations or alternative values of MVDa and MVDb in step 715 and the alternative MVDs of blocks A and B respectively, including the original MVDs of those blocks. At step 720, all of possible combinations of alternatives are accumulated and staged to send through to step 725. Here in step 725, for each combination, ctxIdxInc is calculated for block C. In decision step 730, if any combination causes a change in ctxIdxInc from the value generated using the original MVDs of blocks A and B, one of the alternative MVDa or alternative MVDb is discarded from the list in step 735 and the next possible combination begins to be considered in step 720. If the new ctxIdxInc is not different than the original for block C, then the change is removed from the list in step 720. Similar approaches as which are proposed to process the discard list in Solution 3 can be used.

An alternative implementation examines a previously created list and extracts the subset of those that apply to blocks in the current slice. The method then considers every inter-predicted block in the current slice, one at a time.

Several of the implementations and features described in this application can be used in the context of the H.264/MPEG-4 AVC (AVC) standard. However, these implementations and features can be used in the context of another standard (existing or future), or in a context that does not involve a standard. Thus, provided herein is one or more implementations having particular features and aspects. However, features and aspects of described implementations can also be adapted for other implementations.

The implementations described herein can be implemented in, for example, a method or process, an apparatus, a software program, a datastream, or a signal. Even if only discussed in the context of a single form of implementation such as only being mentioned as a method, the implementation or features discussed can also be implemented in other forms such as an apparatus or program. An apparatus can be implemented in, for example, appropriate hardware, software, and firmware. The methods can be implemented in, for example, an apparatus such as, for example, a computer or other processing device. Additionally, the methods can be implemented by instructions being performed by a processing device or other apparatus, and such instructions may be stored on a computer readable medium such as a CD, or other computer readable storage device, or an integrated circuit. Further, a computer readable medium can store the data values produced by an implementation.

As should be evident to one of skill in the art, implementations may also produce a signal formatted to carry information that can, for example, be stored or transmitted. The information may include, for example, instructions for performing a method, or data produced by one of the described implementations. For example, a signal can be formatted to carry a watermarked stream, an unwatermarked stream, or watermarking information.

Additionally, many implementations can be implemented in one or more of an encoder, a decoder, a post-processor processing output from a decoder, or a pre-processor providing input to an encoder. Further, other implementations are contemplated by this disclosure. For example, additional implementations can be created by combining, deleting, modifying, or supplementing various features of the disclosed implementations.

The invention claimed is:

1. A method comprising:
    accessing encoded data which comprise at least two blocks;
    compiling a list of changes to the encoded data that include a direct change to a block;
    determining motion character of a non-immediate block, non-immediate blocks being adjacent to an immediate block that are immediately adjacent to the block, wherein motion vector differentials are selected as the motion character for at least one of the blocks;
    determining change to the immediate block based on original motion character of the block and the non-immediate block and the motion character of the block that would result from the application of the change;
    storing the change to the list if the change does not cause a difference to the immediate block; and
    evaluating other potential changes if other potential changes are available, wherein the other potential changes are subjected to process steps that are the same as a prior change.

2. The method of claim 1, wherein the compiling step comprises one of:
    generating the list of the possible changes;
    accessing the possible changes from an existing list; or,
    generating some of the possible changes and accessing others of the possible changes from the existing list.

3. The method of claim 1 comprising decoding the encoded data and coding the encoded data.

4. The method of claim 3 comprising determining a context for the encoded data for at least one of the blocks.

5. The method of claim 4 comprising determining a context index for the encoded data, wherein the context index (ctxIdx) is the sum of an initial value (ctxIdxOffset) and an increment (ctxIdxInc).

6. The method of claim 5 comprising:
    calculating an original increment for the immediate block and a new increment for the immediate block associated with the direct change to the block; and
    using the original and new increments as a criterion for determining the difference in the storing step.

7. The method of claim 5 comprising:
    selecting motion vector differentials as being the motion character for at least one of the blocks.
    calculating an original increment for the immediate block and a new increment for the immediate block associated with the direct change to the block; and
    using a motion vector differential of the non-immediate block and the original and new motion vector differentials for the block as a criterion for determining the difference in the storing step.

8. The method of claim 5 comprising:
    determining if the original increment for the immediate block and a new increment for the immediate block are different; and
    storing the change in the list in the storing step if the original and new increments are not different.

9. The method of claim 8 comprising:
    calculating an original increment for another immediate block and a new increment for the another immediate block associated with the direct change to the block, if the original and new increments are not different for the immediate block;
    determining if the original increment for the immediate block and a new increment for the another immediate block are different; and
    storing the change in the list in the storing step, if the original and new increments for the another immediate block are not different.

10. The method of claim 5 comprising:
    calculating an original increment for another immediate block and a new increment for the another immediate block associated with the direct change to the block, if the original and immediate increments are not different for the immediate block; and
    using the original and new increments for the another immediate block as an additional criterion for determining the difference in the storing step.

11. The method of claim 5 comprising:
    calculating an original increment for an another immediate block and a new increment for the another immediate block associated with the direct change to the block, if the original and new increments are not different for the immediate block; and
    using a motion vector differential of an another non-immediate block that is adjacent to the another immediate block and the original and new motion vector differentials for the block as an additional criterion for determining the difference in the storing step.

12. A method comprising:
    Step a) providing or accessing data in block form, wherein the form includes a current block (A) having at least first and second immediate blocks (R, D) which are adjacent to the current block (A) and share a finite common border therewith, and the form includes at least first and second non-immediate blocks (M, N) which are adjacent to the first and second immediate blocks, respectively, and share a finite border therewith and are not adjacent to the current block;
    Step b) calculating or determining an original syntax increment ctxIdxInc of the immediate blocks based on original motion vector differentials (MVD) pairs of the current block A and non-immediate blocks (M, N) of the respective immediate blocks;
    Step c) calculating or providing a modified syntax increment ctxdxInc of the first immediate block (R) based on an alternative MVD of the first non-immediate block (M) and an alternative MVD of the current block (A);
    Step d) comparing the modified and original syntax increments of the first immediate block (R),
    Step e) adding the alternative MVD of the current block (A) to a discard list, if the modified and original syntax increments of the first immediate block (R) are not equal.

13. The method of claim 12 comprising:
    Step f) obtaining or generating an alternative MVDs of a second non-immediate block (N), if the modified and original syntax increments of the first immediate block (R) are equal and there are no additional alternative MVDs for the first non-immediate block (M);

Step g) calculating or providing a modified syntax increment ctxdxInc of the second immediate blocks (D) based on the alternative MVD of the second non-immediate block (N) and another alternative MVD of the current block (A);

Step h) comparing the modified and original syntax increments of the second immediate block (D), and Step i) adding the alternative MVD of the current block (A) and the alternative MVD of the second immediate block (D) to a discard list, if the modified and original syntax increments of the second immediate block (D) are not equal.

14. The method of claim 13 comprising:

obtaining or generating an additional alternative MVDs of the second non-immediate block (N), if the modified and original syntax increments of the second immediate block (D) are equal and there are additional alternative MVDs for the second non-immediate block (N); and cycling back through to the Step g calculating or providing step and subsequent other steps.

15. The method of claim 14 comprising:

saving the alternative MDV of the current block (A) in a compliance list, if the modified and original syntax increments of the second immediate block (D) are equal and there are no additional alternative MVDs for the non-immediate block (N);

obtaining or generating a next alternative MVDs for the current A, if there are more alternative MVDs for current block A; and cycling back through to the Step b calculating or providing step and subsequent other steps.

16. The method of claim 13 comprising:

obtaining or generating an additional alternative MVDs of the first non-immediate block (M), if the modified and original syntax increments of the first immediate block (R) are equal and there are additional alternative MVDs for the first non-immediate block (M); and cycling back through to the Step b calculating or providing step and subsequent other steps.

17. The method of claim 12 wherein the data is video data and the syntax increments correlate to watermarks.

18. The method of claim 17 comprising:

selecting a watermarks associated with entries in the compliance list and coding the video data.

19. A method comprising:

a) generating or accessing a list of alternative motion vector differentials for a slice of video data, the alternative motion vector differentials being associated with potential changes or watermarks to the video data b) accessing current blocks (C) within the slice;

c) determining if the motion vector differentials of first neighboring blocks (A) and a second neighboring blocks (B) of the current blocks (C) used to calculate an increment (ctxIdxInc) of a context index (ctxIdx) for the current blocks (C) are in the list;

d) collecting alternative values of motion vector differentials (MVDa, MVDb) for the first neighboring blocks (A) and the second neighboring blocks (B) for those motion vector differentials of first neighboring blocks (A) and a second neighboring blocks (B) appearing in the list in step c;

e) generating or staging combinations of the collected alternative values of motion vector differentials and original motion vector differentials (MVDa, MVDb), but excluding combinations of having only original motion vector differentials and determining the original increment (ctxIdxInc) associated with the original motion vector differentials of (MVDa, MVDb)

f) determining a new increment (new ctxIdxInc) associated one of the combinations;

g) comparing the new increment (new ctxIdxInc) to the original increment (ctxIdxInc);

h) discarding one of the alternative motion vector differentials in the list if the new increment (new ctxIdxInc) is different than the original increment (ctxIdxInc)

i) cycling through steps f through steps h for others of the combinations.

* * * * *